(12) United States Patent
He et al.

(10) Patent No.: US 12,028,035 B2
(45) Date of Patent: Jul. 2, 2024

(54) MONOLITHIC INTEGRATED BAW RESONATOR PRODUCTION METHOD

(71) Applicant: Huawei Technologies Co., Ltd., Shenzhen (CN)

(72) Inventors: Zhengyu He, Shenzhen (CN); Huilong Xu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 564 days.

(21) Appl. No.: 17/237,611

(22) Filed: Apr. 22, 2021

(65) Prior Publication Data

US 2021/0242848 A1 Aug. 5, 2021

Related U.S. Application Data

(63) Continuation of application No. PCT/CN2018/111496, filed on Oct. 23, 2018.

(51) Int. Cl.
*H03H 3/02* (2006.01)
*H03H 9/205* (2006.01)

(52) U.S. Cl.
CPC ............ *H03H 3/02* (2013.01); *H03H 9/205* (2013.01)

(58) Field of Classification Search
CPC .. H03H 3/02; H03H 9/205; H03H 2003/0428; H03H 2003/0435; H03H 2003/0478
See application file for complete search history.

(56) References Cited

U.S. PATENT DOCUMENTS

| 6,377,137 | B1 | 4/2002 | Ruby |
| 6,420,202 | B1 * | 7/2002 | Barber ................. H03H 3/02 438/52 |
| 6,518,860 | B2 | 2/2003 | Ell et al. |
| 6,566,979 | B2 | 5/2003 | Larson, III et al. |
| 6,657,517 | B2 | 12/2003 | Barber et al. |

(Continued)

FOREIGN PATENT DOCUMENTS

| CN | 103873010 A | 6/2014 |
| CN | 104993804 A | 10/2015 |

(Continued)

OTHER PUBLICATIONS

Zhang et.al., J. Materials Chem. C, 2016, 4, pp. 5133 (Year: 2016).*

(Continued)

*Primary Examiner* — Jeffrey T Carley
*Assistant Examiner* — Jose K Abraham
(74) *Attorney, Agent, or Firm* — Slater Matsil, LLP (57) ABSTRACT

This application provides a monolithic integrated BAW resonator production method, including: preparing an imprint template; forming a mask material layer on a substrate; pressing the mask material layer by using the imprint template in a direction of the substrate, to form a mask groove; performing plasma etching on the substrate by using the mask material layer, as a mask, that is used to form the mask groove, to form, on the substrate, grooves that one-to-one correspond to positions of several mask grooves; and forming, in the several grooves, bottom electrode layers, piezoelectric layers, and top electrode layers that are sequentially stacked, to form resonators of different frequencies.

19 Claims, 8 Drawing Sheets

(56) References Cited

U.S. PATENT DOCUMENTS

| | | | | |
|---|---|---|---|---|
| 6,874,211 B2 * | 4/2005 | Bradley | ............... | H03H 9/564 |
| | | | | 29/25.35 |
| 7,863,071 B1 * | 1/2011 | Ivanov | ............... | B81C 1/00246 |
| | | | | 438/53 |
| 2003/0098761 A1 * | 5/2003 | Takeuchi | ............... | H03H 9/174 |
| | | | | 333/191 |
| 2004/0172798 A1 | 9/2004 | Ruby et al. | | |
| 2008/0129412 A1 * | 6/2008 | Osone | ............... | H03H 9/589 |
| | | | | 333/133 |
| 2010/0277034 A1 * | 11/2010 | Sinha | ............... | H03H 3/04 |
| | | | | 29/25.35 |
| 2015/0162194 A1 * | 6/2015 | Clevenger | ............ | B81C 1/0046 |
| | | | | 438/692 |
| 2018/0062617 A1 | 3/2018 | Yun et al. | | |

FOREIGN PATENT DOCUMENTS

| | | |
|---|---|---|
| CN | 105958956 A | 9/2016 |
| CN | 108449063 A | 8/2018 |
| WO | 2009028269 A1 | 3/2009 |

OTHER PUBLICATIONS

Hou, et.al., J. Semicond., Oct. 2016, 37, 101001 (Year: 2016).*

Forsén, E. et al., "Fabrication of SAW Resonators on Quartz and Langasite using Nano-Imprint Lithography", 2010 IEEE International Ultrasonics Symposium (IUS) Proceedings, Oct. 11-14, 2010, pp. 2091-2094.

Chou, S.Y. et al., "Sub-10 nm imprint lithography and applications", J. Vac. Sci. Technol. B 15(6), Nov.Dec. 1997, pp. 2897-2904.

* cited by examiner

MONOLITHIC INTEGRATED BAW
RESONATOR PRODUCTION METHOD

CROSS-REFERENCE TO RELATED
APPLICATIONS

This application is a continuation of International Application No. PCT/CN2018/111496, filed on Oct. 23, 2018, the disclosure of which is hereby incorporated by reference in its entirety.

TECHNICAL FIELD

This application relates to the field of resonant component technologies, and in particular, to a monolithic integrated BAW resonator, a production method thereof, a filter, and a terminal.

BACKGROUND

Due to limitation of a size and costs of a terminal device, a development trend of a radio frequency front-end element is inevitably miniaturization and integration. A radio frequency filter is one of the most important radio frequency front-end elements. A main function of the radio frequency filter is enabling an electromagnetic wave with a specific frequency range to pass through. Such selectivity for a frequency of the electromagnetic wave may be implemented by using various technologies. Currently, in a terminal, for example, a mobile phone, a piezoelectric resonator generally completes this task. A common piezoelectric resonator is, for example, a bulk acoustic wave (BAW) resonator. A frequency of the BAW resonator is determined by a thickness of a piezoelectric material, and a center frequency reflects a difference in working frequencies of the resonator. To meet requirements such as a multi-band, a small size, and low costs at the same time, implementing BAW resonators of a plurality of frequencies on a single chip becomes an inevitable development trend.

SUMMARY

Embodiments of this application provide a monolithic integrated BAW resonator production method that can implement a multi-band and a small size and that has a simple production process.

An embodiment of this application provides a monolithic integrated BAW resonator production method, and the method includes the following steps.

Step 1: Prepare an imprint template, where the imprint template includes an imprint plate and a plurality of imprint dies protruding from a surface of the imprint plate, and at least two imprint dies in the plurality of imprint dies have different protruding heights relative to the surface of the imprint plate.

Step 2: Form a mask material layer on a substrate. A material of the mask material layer in this embodiment is a high-molecular polymer, and a material of the substrate is an insulating material that includes but is not limited to silicon dioxide/silicon.

Step 3: Press the mask material layer in a direction of the substrate by using the imprint template, to form, on the mask material layer through imprinting, a plurality of mask grooves with depths consistent with heights of the imprint dies. Based on different depths, the mask grooves may be through-grooves that penetrate the mask material layer, or may be in a groove form with a bottom that is not penetrated.

Step 4: Perform plasma etching on the substrate by using the mask material layer as a mask, to form, on a surface of the substrate, grooves that one-to-one correspond to positions of the several mask grooves, where depths of at least two grooves in the several grooves are different. In this step, the mask groove penetrates a groove corresponding to the mask groove.

Step 5: Form, in the several grooves, bottom electrode layers, piezoelectric layers, and top electrode layers that are sequentially stacked, to form resonators of different frequencies at positions of the grooves after a mask pattern layer is removed, where in a direction perpendicular to the substrate, thicknesses of the several bottom electrode layers are the same and are all less than depths of the grooves, and piezoelectric layer thicknesses of at least two resonators in the several resonators are different, or top electrode layer thicknesses of at least two resonators are different.

In the monolithic integrated BAW resonator production method in this embodiment of this application, a mask is formed by using the imprint template and the mask pattern layer, several grooves used for forming resonators are defined on the substrate, and depths of at least two grooves in the several grooves are different. Based on different depths of the grooves, the grooves are used as thickness limiting areas of the resonators, and piezoelectric layers of different thicknesses or top electrode layers of different thicknesses are formed in the grooves by using a patterning process, so that different center frequencies of the resonators are implemented, and further, multi-band resonators are formed on the same substrate, thereby implementing miniaturization. Further, in the method in this application, thickness limiting areas of (groove) resonators of different depths are directly defined on the substrate by using an imprinting technology, so that use of a photolithography process can be avoided. In addition, in a subsequent process of forming the bottom electrode layer, the piezoelectric layer, and the top electrode layer, same functional layers of several resonators can be implemented by using only one photolithography process based on different vibration frequencies, and it is not required to perform photolithography once on each resonator to implement different piezoelectric layer thicknesses, thereby greatly simplifying a production process and greatly reducing production costs.

Further, the step of forming, in the several grooves, bottom electrode layers, piezoelectric layers, and top electrode layers that are sequentially stacked includes: forming a bottom electrode layer in each groove by using the mask pattern layer as a mask and by using a same photolithography process; and forming the piezoelectric layers on the several bottom electrode layers by using the mask pattern layer as a mask and by using a same photolithography process, so that a sum of a thickness of the bottom electrode layer and a thickness of the piezoelectric layer in each groove is equal to or less than a depth of the groove.

In this step, because depths of at least two grooves in the several grooves are different, and thicknesses of the several bottom electrode layers are the same, when the piezoelectric layers are formed, thicknesses of material layers used for forming the piezoelectric layers are consistent, and an overall thickness may be increased or decreased, so that thicknesses of the piezoelectric layers, namely, the several piezoelectric layers, in the grooves are the same. In addition, the piezoelectric layers that protrude from the grooves may be formed, to implement piezoelectric layers of different thicknesses. In these two manners, BAW resonators of different frequencies are respectively implemented by using the top electrode layers of different thicknesses and the piezoelectric layers of different thicknesses. In the method in this application, a center frequency of the resonator may be changed by changing the thickness of the piezoelectric layer or the thickness of the top electrode layer, thereby improving production flexibility.

In an embodiment, the step of forming the piezoelectric layers on the several bottom electrode layers by using a same photolithography process, so that a sum of a thickness of the bottom electrode layer and a thickness of the piezoelectric layer in each groove is equal to or less than a depth of the groove includes: forming piezoelectric material layers on the several bottom electrode layers by using the mask pattern layer as a mask, where each piezoelectric material layer protrudes from the surface that is of the substrate and on which the groove is disposed; removing the mask pattern layer; and polishing the piezoelectric material layer until a surface of the piezoelectric material layer is flush with the surface of the substrate, to form the piezoelectric layer. In this embodiment, a thickness of the piezoelectric layer can be made relatively thin and flat, so that a resonance frequency of the resonator can be improved. In addition, in this method, because depths of the several grooves are different, thicknesses formed inside the grooves by using piezoelectric material layers of a same thickness are naturally different. Then, the piezoelectric material layers are polished by using the surface of the substrate as a reference, and finally, piezoelectric layers of different thicknesses are formed. It is not required to perform photolithography on each piezoelectric layer to reduce the thickness, and therefore, a production process is simple.

Based on this embodiment, the step of forming, in the several grooves, bottom electrode layers, piezoelectric layers, and top electrode layers that are sequentially stacked includes: depositing, on the surface of the substrate, a top electrode material layer that covers the several piezoelectric layers; and processing the top electrode material layer, to form a top electrode layer on each piezoelectric layer, where thicknesses of several top layer electrode layers are the same. A transverse width that is of the top electrode layer and that is perpendicular to a thickness direction is the same as a transverse width of the piezoelectric layer. In this embodiment, different resonance frequencies of several BAW resonators are implemented by using different thicknesses of the piezoelectric layers.

In another implementation, the step of forming, in the several grooves, bottom electrode layers, piezoelectric layers, and top electrode layers that are sequentially stacked includes: forming the piezoelectric layers on the bottom electrode layers in the several grooves by using the mask pattern layer as a mask, so that a sum of a thickness of the bottom electrode layer and a thickness of the piezoelectric layer is less than a depth of the groove, and thicknesses of the piezoelectric layers in the several grooves are the same; and producing the top electrode layers to implement different resonance frequencies.

After the step of forming the piezoelectric layers on the bottom electrode layers in the several grooves by using the mask pattern layer as a mask, the method further includes: depositing, by using the mask pattern layer as a mask, a top electrode material layer that covers the piezoelectric layers in the several grooves, and then removing the mask pattern layer after patterning the top electrode material layer, to form a top electrode material layer that protrudes from the surface of the substrate out of the groove. Specifically, a top electrode material base layer that covers the surface of the substrate and the several piezoelectric layers in the grooves is deposited on the surface of the mask pattern layer and in the grooves by depositing a metal layer, and the grooves are filled with parts in the grooves. Then, the top electrode material base layer is processed by using a photolithography process to form top electrode material layers that cover the several piezoelectric layers and that one-to-one correspond to the several piezoelectric layers. In this case, because depths of the grooves are different, thicknesses of the several piezoelectric layers are the same, and thicknesses of the bottom electrode layers are the same, thicknesses of the top electrode material layers are different.

A protruding part of the top electrode material layer is polished until a surface of the top electrode material layer is flush with the surface of the substrate, to form the top electrode layer. In this embodiment, the bottom electrode layer, the piezoelectric layer, and the top electrode layer are all produced by using the mask pattern layer as a mask, and a mask plate does not need to be replaced, and the mask plate can be completed without a need to perform photolithography for a plurality of times, thereby simplifying a processing process and reducing costs.

In an implementation, when plasma etching is performed on the substrate by using the mask pattern layer as a mask, etching is performed by using an Ar+ ion. Because a mechanism of Ar+ ion etching is etching caused by physical bombardment of particles, an etching rate of the mask material layer of a high-molecular polymer and an etching rate of the substrate are basically the same. Within same etching time, it is ensured that all remaining high-molecular polymers in the several mask grooves can be etched through Ar+ etching, and corresponding grooves are etched on the substrate.

Further, the imprint template is formed by using a quartz material by using an ion milling process. In the method in this application, the imprint template may be reused, and the height of the imprint die may be adjusted based on a resonance frequency required by the resonator, thereby further reducing production costs.

Further, materials of the bottom electrode layer and the top electrode layer include but are not limited to metal such as molybdenum, tungsten, and aluminum. A material of the piezoelectric layer includes but is not limited to aluminum nitride, lithium niobate, and the like.

Further, the step of pressing the mask material layer in a direction of the substrate by using the imprint template, to form, on the mask material layer through imprinting, a plurality of mask grooves with depths consistent with heights of the imprint dies, so as to form a mask pattern layer by using the mask material layer after removing the imprint template specifically includes: applying specific external force to the imprint template, to press the mask material layer in the direction of the substrate, so that the mask material layer can be better attached to each surface of the imprint die on the imprint template to form an exact-size mask groove.

After the substrate on which the imprint template is pressed is heated, the imprint template is removed to form the mask pattern layer including the several mask grooves, where the mask groove is a pattern formed after the imprint die is removed from the mask material layer.

In the monolithic integrated BAW resonator production method in the embodiments of this application, the imprinting technology is used to produce a reusable imprint template to define a position and a thickness of the resonator, piezoelectric layers or top electrode layers of different thicknesses are directly formed by using the photolithography process, and several BAW resonators of different frequencies are formed on the same substrate, so that require-

DETAILED DESCRIPTION OF ILLUSTRATIVE EMBODIMENTS

The following clearly describes the technical solutions in the implementations of the present invention with reference to the accompanying drawings in the implementations of the present invention.

This application provides a monolithic integrated BAW resonator production method, to produce a monolithic integrated multi-band BAW resonator that can implement miniaturization and a component that has a same sandwich structure as the BAW resonator. In the embodiments, the BAW resonator is used as an example for description, and the BAW resonator is applicable to a filter of a terminal, for example, a mobile phone.

Figure 1:
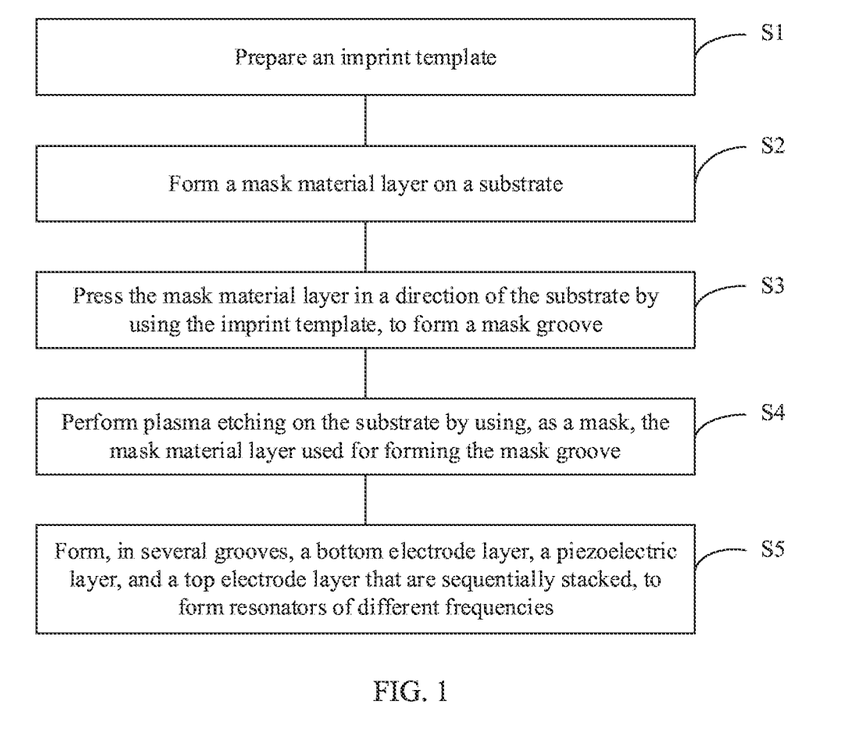
FIG. 1 is a step flowchart of a monolithic integrated BAW resonator production method according to this application.

In the embodiments, FIG. 1 is a step flowchart of a monolithic integrated BAW resonator production method, and the method includes the following steps.

Figure 2:
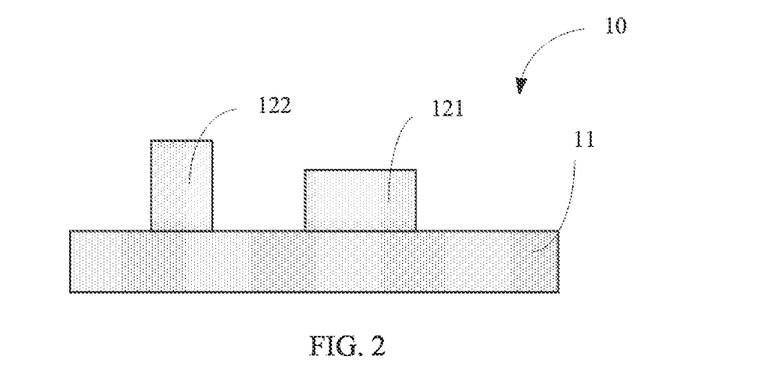
FIG. 2 is a schematic cross-sectional diagram of an imprint template formed in an imprinting method for the monolithic integrated BAW resonator shown in FIG. 1.

Step S1: FIG. 2 is a schematic cross-sectional diagram of an imprint template. An imprint template 10 is provided, where the imprint template includes an imprint plate 11 and a plurality of imprint dies protruding from a surface of the imprint plate 11, and at least two imprint dies in the plurality of imprint dies have different protruding heights relative to the surface of the imprint plate 11. The imprint plate 11 is in a plate form, the plurality of imprint dies are at least two imprint dies, and heights are different when there are two imprint dies. In this embodiment, there are two imprint dies: an imprint die 121 and an imprint die 122. In other words, the following steps are described by using production of two resonators on different frequency bands as an example.

Further, the imprint template 10 is formed by using a quartz material by using an ion milling process. In the method in this application, the imprint template 10 may be reused, and a height of the imprint die may be adjusted (a large-size imprint die is reduced) based on a resonance frequency required by the resonator, thereby further reducing production costs.

Figure 3:
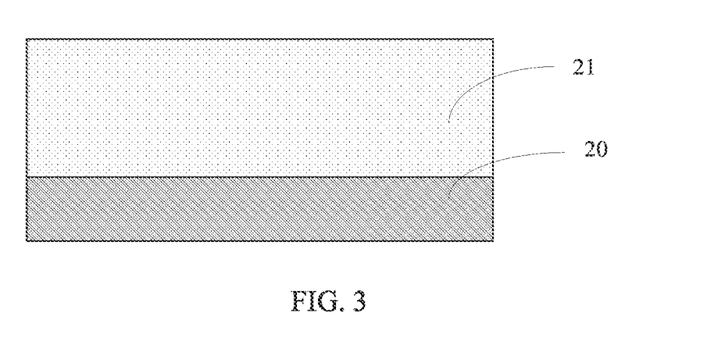
FIG. 3 is a schematic cross-sectional diagram of a substrate formed in an imprinting method for the monolithic integrated BAW resonator shown in FIG. 1.

Step S2: As shown in FIG. 3, a mask material layer 21 is formed on a substrate 20. A material of the mask material layer 21 in this embodiment is a high-molecular polymer, and the substrate 20 is in a plate form, and a material is an insulating material that includes but is not limited to silicon dioxide or silicon. The mask material layer 21 is formed through spin coating. Specifically, the mask material layer 21 is formed on a surface of the substrate 20, and a formed laminated high-molecular polymer is not entirely solidified, and a shape of the laminated high-molecular polymer may be modified.

Figure 4A:
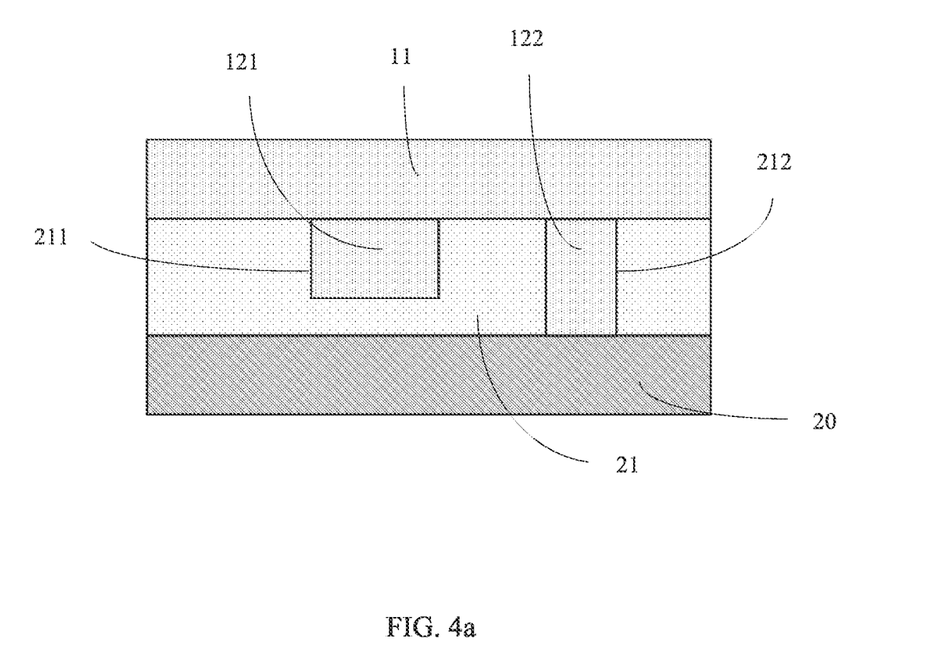
FIG. 4a is a schematic cross-sectional diagram showing that an imprint template is imprinted on a substrate in an imprint method for the monolithic integrated BAW resonator shown in FIG. 1.
Figure 4B:
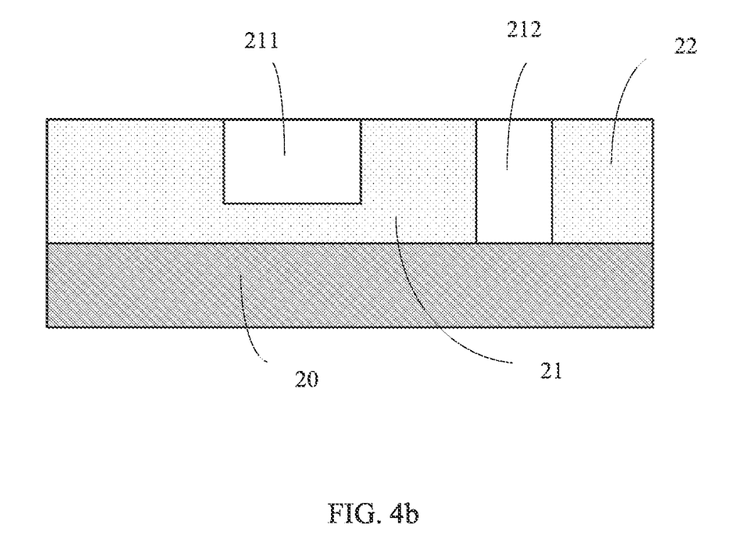
FIG. 4b is a schematic cross-sectional diagram of a substrate after the imprint template in FIG. 4a is removed.

Step S3: As shown in FIG. 4a and FIG. 4b, FIG. 4a is a schematic diagram obtained after the imprint template 10 is pressed on the mask material layer 21, and FIG. 4b is a schematic cross-sectional diagram of the substrate 20 from which the imprint template 10 is removed. The mask material layer is pressed in a direction of the substrate by using the imprint template, to form, on the mask material layer through imprinting, a plurality of mask grooves with depths consistent with heights of the imprint dies. Specifically, the imprint template 10 is used to press the mask material layer 21 in the direction of the substrate 20 to form a mask pattern layer 22. The plurality of imprint dies are imprinted on the mask material layer 21 to form a plurality of mask grooves with depths consistent with the heights of the imprint dies. The mask pattern layer 22 includes the mask grooves obtained after the imprint dies are removed. In this embodiment, the imprint die 121 and the imprint die 122 are imprinted on the mask material layer 21 to form a plurality of mask grooves 211 and 212 whose depths are consistent with the heights of the imprint dies. Based on different depths, the each of mask groove 211 and the mask groove 212 may be a through-groove that penetrates the mask material layer 21, or may be in a groove form with a bottom that is not penetrated.

This step specifically includes: applying specific external force to the imprint template 10, to press the mask material layer 21 in the direction of the substrate 20, so that the imprint die 121 and the imprint die 122 are inserted into the mask material layer 21 from above the surface of the substrate 20, and the mask material layer 21 can be better attached to surfaces of the imprint die 121 and the imprint die 122 on the imprint template 10 to form an exact-size mask groove 211 and an exact-size mask groove 212.

After the substrate 20 on which the imprint template 10 is pressed is heated, the imprint template 10 is removed to form the mask pattern layer including the several mask grooves, and the mask groove is a pattern formed after the imprint die is removed from the mask material layer 21, in other words, the mask material layer 21 forms the mask pattern layer 22. In this embodiment, the several mask grooves include the mask groove 211 and the mask groove 212. A heating temperature in this step is a temperature that does not affect a form of the mask material layer 21, to ensure a size of the mask groove.

Figure 5:
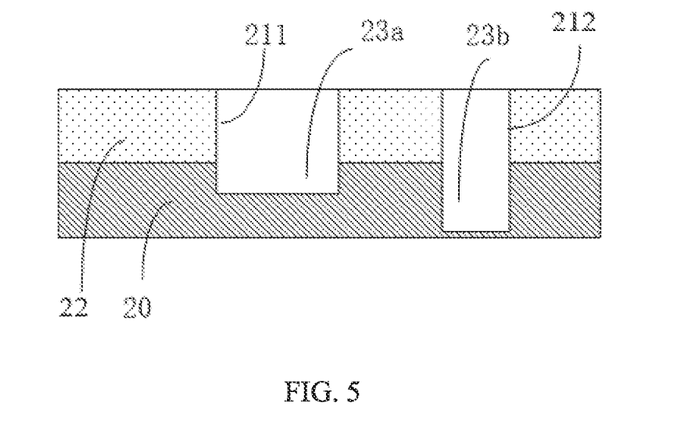
FIG. 5 is a schematic cross-sectional diagram of a substrate that includes a mask pattern layer and that is obtained after etching in FIG. 4b.

Step S4: FIG. 5 is a schematic diagram of etching performed by using the mask pattern layer 22 as a mask, to form the mask material layer with the mask grooves, in other words, plasma etching is performed on the substrate 20 by using the mask material layer as a mask, so that several grooves that one-to-one correspond to positions of the several mask grooves 211 and 212 are formed on the surface of the substrate 20 within same etching time, where at least two grooves in the several grooves are different in depth, and are a groove 23a and a groove 23b. In this step, the mask grooves 211 and 212 penetrate the corresponding grooves 23a and 23b, and a depth of the groove 23a is less than a depth of the groove 23b.

As shown in FIG. 5, in this embodiment, when plasma etching is performed on the substrate 20 by using the mask pattern layer 22 as a mask, etching is performed by using an Ar+ ion. In another implementation, another high-precision physical etching method, for example, He+ ion etching, may be used. Because a mechanism of Ar+ ion etching is etching caused by physical bombardment of particles, an etching rate of the mask material layer 21 of a high-molecular polymer and an etching rate of the substrate 20 are basically the same. Within same etching time, it is ensured that etching depths are consistent, so that it can be ensured that all remaining high-molecular polymers in the several mask grooves 211 can be etched through Ar+ etching, and corresponding grooves can be etched on the substrate 20. In addition, because the depths of the mask grooves 211 and 212 are different, and etching depths are the same in a same etching step, after the mask grooves 211 and 212 are penetrated through etching, depths of the grooves 23a and 23b formed on the substrate 20 are different. The groove 23a and the groove 23b are areas for defining a position and a thickness of the BAW resonator.

Step S5: Form, in the several grooves, bottom electrode layers, piezoelectric layers, and top electrode layers that are sequentially stacked, to form resonators of different frequencies. In other words, a resonator is formed in each groove, and the resonator may protrude from the groove, may be located in the groove and is flush with a surface on which a groove opening is located, or may be located inside the groove when required in a design. In a direction perpendicular to the substrate, thicknesses of the several bottom electrode layers are the same and are all less than the depths of the grooves, and piezoelectric layer thicknesses of at least two resonators in the several resonators are different, or top electrode layer thicknesses of at least two resonators are different.

Figure 6:
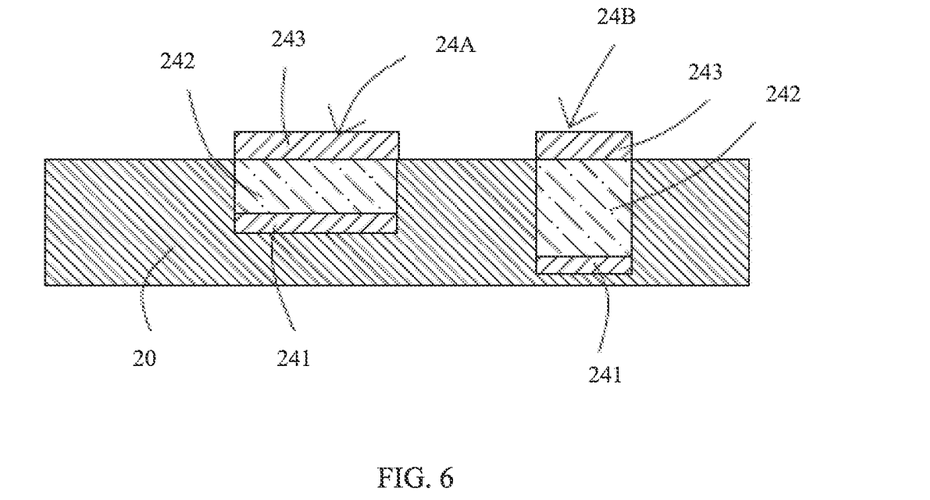
FIG. 6 is a schematic cross-sectional diagram of a monolithic integrated BAW resonator formed in a first embodiment of an imprinting method for a monolithic integrated BAW resonator shown in FIG. 1.
Figure 7:
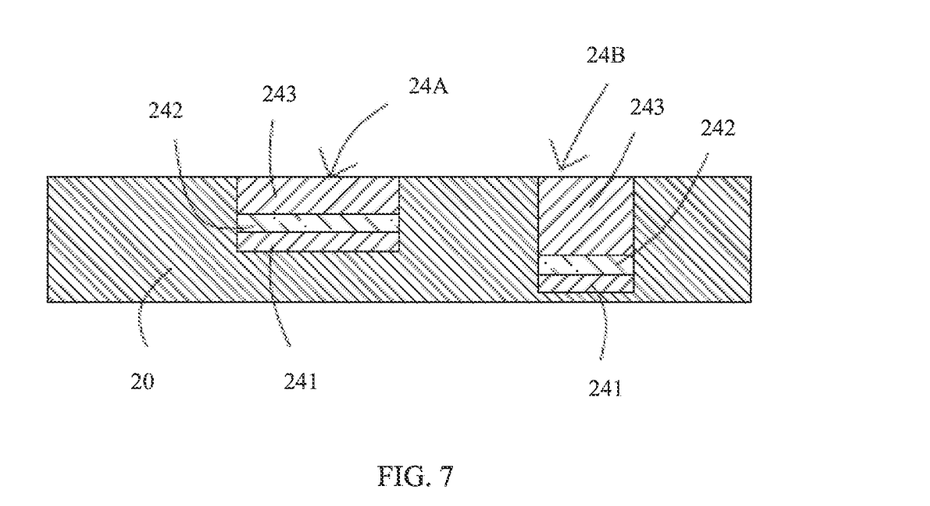
FIG. 7 is a schematic cross-sectional diagram of a monolithic integrated BAW resonator formed in a second embodiment of an imprinting method for a monolithic integrated BAW resonator shown in FIG. 1.

Specifically, FIG. 6 and FIG. 7 are schematic cross-sectional diagrams of two embodiments of a monolithic integrated BAW resonator produced by using this method.

A bottom electrode layer 241, a piezoelectric layer 242, and a top electrode layer 243 that are sequentially stacked are formed in the groove 23a and the groove 23b. Further, resonators 24A and 24B of different frequencies are formed at positions of the groove 23a and the groove 23b. In the direction perpendicular to the substrate 20, thicknesses of the bottom electrode layer 241 in the groove 23a and the bottom electrode layer 241 in the groove 23b are the same and are both less than depths of the groove 23a and the groove 23b. As shown in FIG. 6, a thickness of the piezoelectric layer 242 of the resonator 24A and a thickness of the piezoelectric layer 242 of the resonator 24B are different, or as shown in FIG. 7, a thickness of the top electrode layer 243 of the resonator 24A and a thickness of the top electrode layer 243 of the resonator 24B are different.

In the monolithic integrated BAW resonator production method in this embodiment of this application, a mask is formed by using the imprint template 10 and the mask pattern layer 22, several grooves used for forming resonators are defined on the substrate 20, and depths of at least two grooves 23a and 23b in the several grooves are different. Based on different depths of the grooves, the grooves are used as thickness limiting areas of the resonators, and piezoelectric layers of different thicknesses or top electrode layers of different thicknesses are formed in the grooves by using a patterning process, so that different center frequencies of the resonators are implemented, and further, multi-band resonators are formed on the same substrate 20, thereby implementing miniaturization. Further, in the method in this application, thickness limiting areas and transverse areas (a length and a width of the resonator) of (groove) resonators of different depths are directly defined on the substrate 20 by using an imprinting technology, and lengths and widths of bottom electrode layers, a piezoelectric layer, and a top electrode layer of the resonator can be determined at once by using the groove. A length and a width of each electrode do not need to be defined by using a plurality of photolithography processes, and use of the plurality of photolithography processes can be avoided. In addition, in a subsequent process of forming the bottom electrode layer, the piezoelectric layer, and the top electrode layer, same functional layers of several resonators can be implemented by using only one photolithography process based on different vibration frequencies, and it is not required to perform photolithography once on each resonator to implement different piezoelectric layer thicknesses, thereby greatly simplifying a production process and greatly reducing production costs.

Further, step S5 specifically includes the following steps.

Figure 8A:
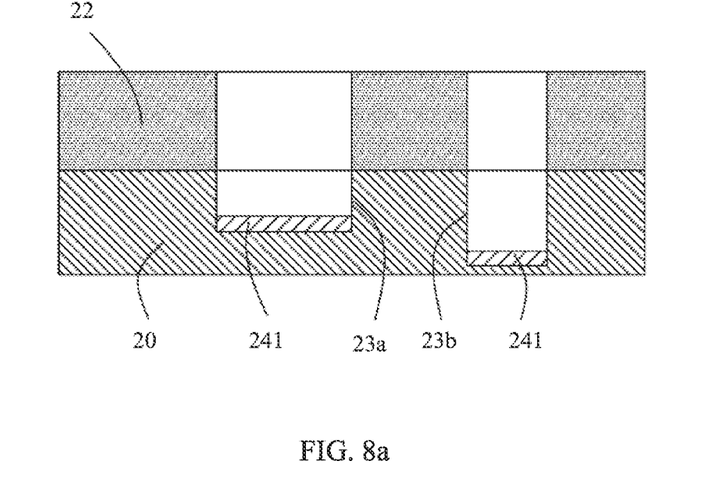
FIG. 8a, FIG. 8b, FIG. 9a, and FIG. 9b are schematic cross-sectional diagrams of layers in a process of forming a monolithic integrated BAW resonator shown in FIG. 6.
Figure 10A:
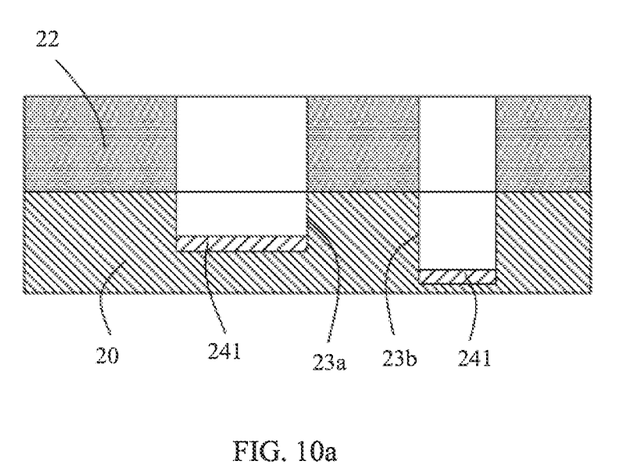
FIG. 10a, FIG. 10b, FIG. 11a, and FIG. 11b are schematic cross-sectional diagrams of layers in a process of forming a monolithic integrated BAW resonator shown in FIG. 7.

In a first step, a bottom electrode layer is formed in each groove by using the mask pattern layer 22 as a mask and by using a same photolithography process. Specifically, metal is evaporated on a surface of the mask pattern layer 22 and in the groove 23a and the groove 23b through metal evaporation, to form metal bottom electrode layers 241 in the groove 23a and the groove 23b, as shown in FIG. 8a or FIG. boa.

In a second step, piezoelectric layers are on the several bottom electrode layers by using the mask pattern layer as a mask and by using a same photolithography process, so that a sum of a thickness of the bottom electrode layer and a thickness of the piezoelectric layer in each groove is equal to or less than a depth of the groove. This step includes two implementations.

Then, the mask pattern layer 22 is removed, and the groove 23a and the groove 23b are formed on the substrate 20.

Figure 8B:
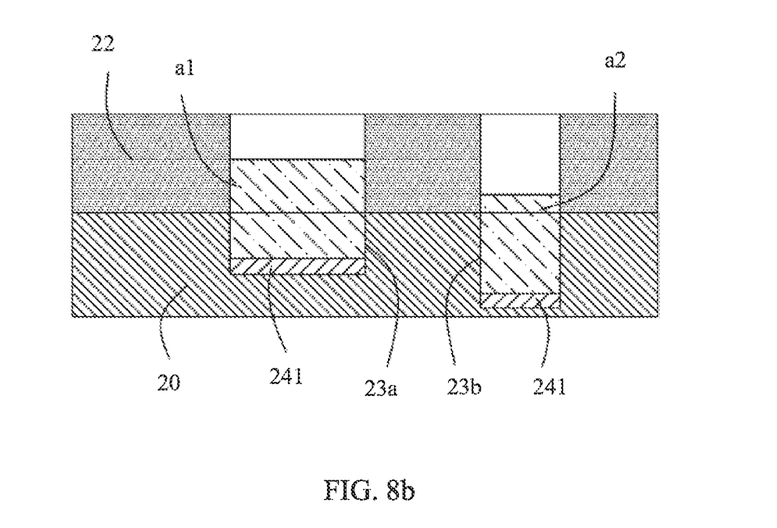
Figure 9A:
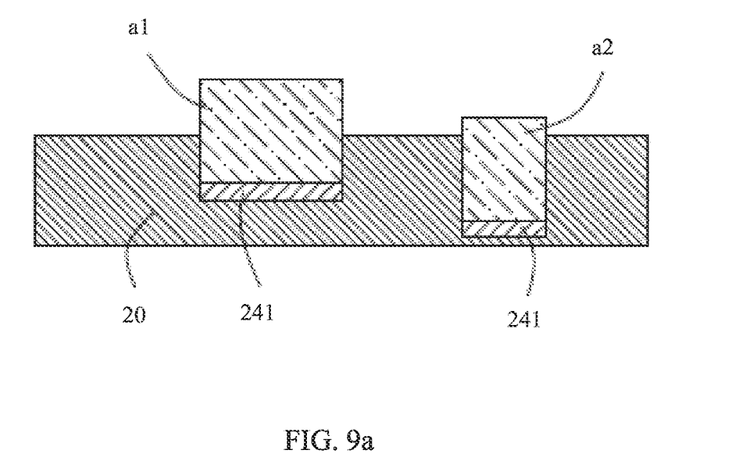
Figure 9B:
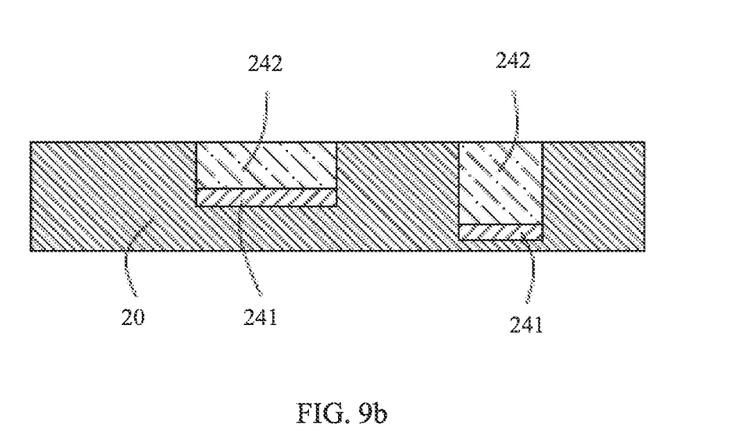

Specifically, one implementation is shown in FIG. 8b, FIG. 9a, and FIG. 9b.

As shown in FIG. 8b, a piezoelectric material layer a1 and a piezoelectric material layer a2 are respectively formed on the bottom electrode layer 241 in the groove 23a and the bottom electrode layer 241 in the groove 23b by using the mask pattern layer as a mask and by using a photolithography process. The piezoelectric material layer a1 and the piezoelectric material layer a2 protrude from a surface that is of the substrate 20 and on which the groove is disposed, in other words, the piezoelectric material layer a1 and the piezoelectric material layer a2 are projected into the mask grooves.

As shown in FIG. 9a, the mask pattern layer 22 is removed, and parts that are of the piezoelectric material layer a1 and the piezoelectric material layer a2 and that protrude from the surface of the substrate are exposed. In this step, the mask pattern layer 22 is removed by using organic solvent such as acetone.

As shown in FIG. 9b, the parts that are of the piezoelectric material layer a1 and the piezoelectric material layer a2 and that protrude from the surface of the substrate are polished until surfaces of the piezoelectric material layer a1 and the piezoelectric material layer a2 are flush with the surface of the substrate 20, to form the piezoelectric layers 242. Because the depth of the groove 23a and the depth of the groove 23b are different, thicknesses formed after the piezoelectric material layers a1 and a2 of a same thickness are used to fill the grooves 23a and 23b are naturally different. Then, the piezoelectric material layers a1 and a2 are polished by using the surface that is of the substrate and on which the groove is disposed 20 as a reference, and finally, the piezoelectric layers 242 of different thicknesses in the groove 23a and the groove 23b are formed. Therefore, different frequency bands of the resonators can be implemented without a need to perform photolithography on each piezoelectric layer 242 to reduce the thickness, and a production process is simple. In addition, in this method, the bottom electrode layer and the piezoelectric layer can be formed by using only one mask pattern layer 22, thereby reducing process steps of producing a mask, a quantity of photolithography times, and costs.

As shown in FIG. 6, in this embodiment, a top electrode material layer that covers the several piezoelectric layers 242 is deposited on the surface of the substrate 20. Specifically, the top electrode material layer is formed through deposition and covers the surface of the substrate 20 and surfaces that are of the several piezoelectric layers 242 and that protrude from the grooves 23.

The top electrode material layer is processed by using a same patterning process, to form top electrode layers 243 on the piezoelectric layer 242 of the groove 23a and the piezoelectric layer 242 of the groove 23b. The two top electrode layers 243 are the same in thickness, one surface of the top electrode layer 243 is connected to the surface of the substrate 20, and the other surface is located on a plane parallel to the substrate 20. A transverse width that is of the top electrode layer 243 and that is perpendicular to a thickness direction is the same as a transverse width of the piezoelectric layer 242. In this embodiment, different resonance frequencies of several BAW resonators are implemented by using different thicknesses of the piezoelectric layers 242. The patterning process includes coating a material layer and making a pattern by using a process such as etching, developing, and photolithography.

Figure 10B:
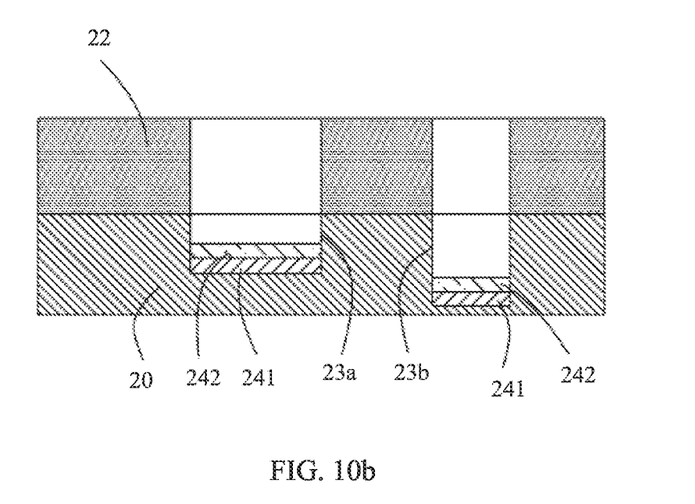
Figure 11A:
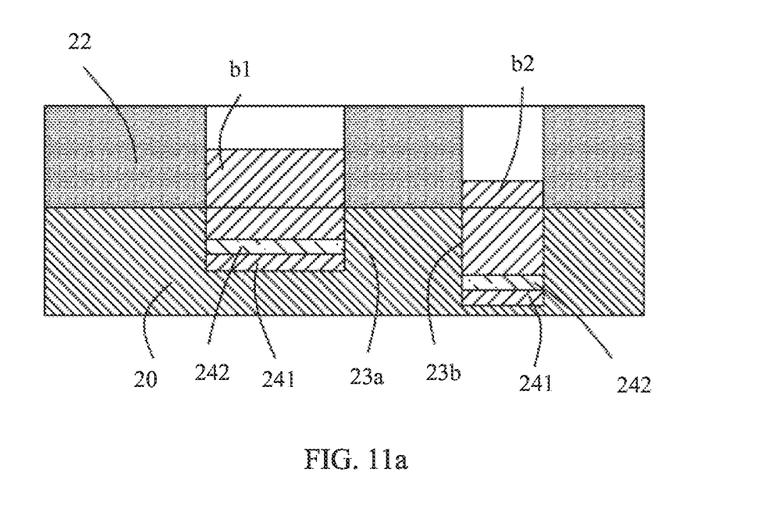
Figure 11B:
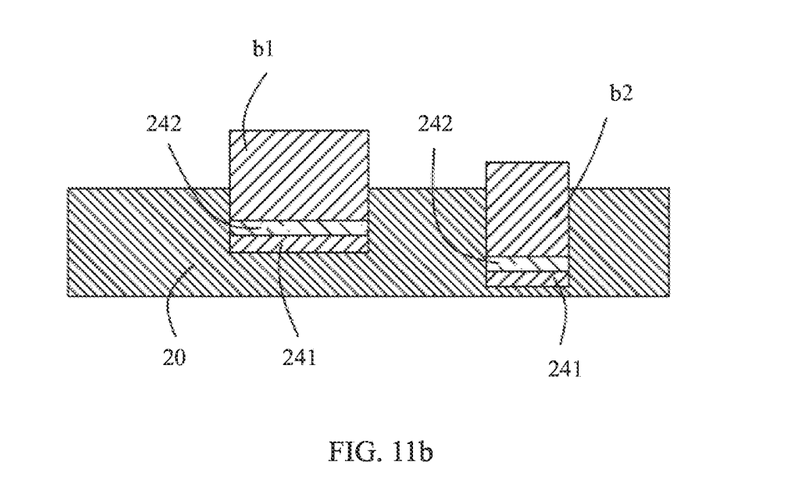

Another implementation is shown in FIG. boa, FIG. 10b, FIG. 11a, and FIG. 11b.

As shown in FIG. boa and FIG. 10b, in a first step, bottom electrode layers 241 are formed, by using the mask pattern layer as a mask and by using a same patterning process, in the groove 23a and the groove 23b on the substrate 20 shown in FIG. boa, and a piezoelectric layer 242 is formed on the bottom electrode layer 241, so that the piezoelectric layer 242 in the groove 23a and the piezoelectric layer 242 in the groove 23b are lower than the surface of the substrate 20, in other words, the piezoelectric layer is located inside the groove, and a surface away from the bottom electrode layer is lower than the surface of the substrate 20. A thickness of the piezoelectric layer 242 in the groove 23a and a thickness of the piezoelectric layer 242 in the groove 23b are the same, and a surface that faces the outside of the groove is a horizontal plane, to ensure flatness of the top electrode layer.

As shown in FIG. 11a, in a second step, a top electrode material base layer that covers the several piezoelectric layers 242 is deposited on the surface of the substrate 20 by using the mask pattern layer 22 as a mask. Specifically, a top electrode material base layer that covers the surface of the substrate 20 and the several piezoelectric layers 242 in the groove 23a and the groove 23b is deposited on a surface of the mask pattern layer and in the groove 23a and the groove 23b by depositing a metal layer, and the groove 23a and the groove 23b are filled with parts in the groove 23a and the groove 23b. In this case, because depths of the grooves 23 are different, thicknesses of the several piezoelectric layers 242 are the same, and thicknesses of the bottom electrode layers 241 are the same, thicknesses of the top electrode material base layer in the groove 23a and the groove 23b are different.

As shown in FIG. 11b, in a third step, the mask pattern layer 22 is removed to form top electrode material layers b protruding from the surface of the substrate 20 out of the groove 23a and the groove 23b, and thicknesses of the top electrode material layers b are different.

As shown in FIG. 7, in a fourth step, the top electrode material layer b protruding from the surface of the substrate 20 is polished until a surface of the top electrode material layer b is flush with the surface of the substrate 20 to form the top electrode layer 243. In this case, an outer surface of the top electrode layer 243 is flush with the surface of the substrate 20.

In this step, because depths of at least two grooves in the several grooves are different, and thicknesses of the several bottom electrode layers 241 are the same, when the piezoelectric layers 242 are formed, thicknesses of material layers used for forming the piezoelectric layers 242 are consistent, and an overall thickness may be increased or decreased, so that thicknesses of the piezoelectric layers 242, namely, the several piezoelectric layers 242, in the grooves are the same. In addition, the piezoelectric layers 242 that protrude from the grooves may be formed, to implement piezoelectric layers 242 of different thicknesses. In these two manners, BAW resonators of different frequencies are respectively implemented by using the top electrode layers 243 of different thicknesses and the piezoelectric layers 242 of different thicknesses. Therefore, in the method in this application, a center frequency of the resonator may be changed by changing the thickness of the piezoelectric layer 242 or the thickness of the top electrode layer 243, thereby improving production flexibility.

Further, materials of the bottom electrode layer 241 and the top electrode layer 243 include but are not limited to metal such as molybdenum, tungsten, and aluminum. A material of the piezoelectric layer 242 includes but is not limited to aluminum nitride, lithium niobate, and the like.

The foregoing descriptions are preferable implementations of the present invention. It should be noted that a person of ordinary skill in the art may make improvements and polishing without departing from the principle of the embodiments of the present invention and the improvements and polishing shall fall within the protection scope of the embodiments of the present invention.

What is claimed is:

1. A monolithic integrated bulk acoustic wave (BAW) resonator production method, comprising:
    forming an imprint template, wherein the imprint template comprises an imprint plate and a plurality of imprint dies protruding from a surface of the imprint plate, and at least two imprint dies of the plurality of imprint dies have different heights relative to the surface of the imprint plate;
    forming a mask material layer on a substrate;

pressing the mask material layer in a thickness direction of the substrate using the imprint template, to form, on the mask material layer through imprinting, a mask pattern layer, wherein the mask pattern layer comprises a plurality of mask grooves having depths corresponding to heights of the imprint dies;

plasma etching the substrate using the mask material layer as a mask, to form, on a surface of the substrate, grooves that one-to-one correspond to positions of the plurality of mask grooves, wherein depths of at least two grooves in the grooves are different, the depths of the at least two grooves being different corresponds to the mask grooves having depths corresponding to the different heights of the imprint dies, and the grooves in the substrate are formed in a single plasma etching process using only the mask material layer as a mask; and forming, in the grooves, bottom electrode layers, piezoelectric layers, and top electrode layers that are sequentially stacked in a direction perpendicular to a major surface of the substrate, wherein in the direction perpendicular to the major surface of the substrate, thicknesses of the bottom electrode layers are the same and are all less than depths of the grooves, and piezoelectric layer thicknesses of at least two piezoelectric layers are different, or top electrode layer thicknesses of at least two top electrode layers are different, and wherein each bottom electrode layer is formed using a single photolithography process that uses the mask pattern layer as a mask, and each piezoelectric layer is formed using another single photolithography process that uses the mask pattern layer as a mask.

2. The method according to claim 1, wherein after the piezoelectric layers are formed, in each groove of the grooves, a sum of a thickness of the bottom electrode layer and a thickness of the piezoelectric layer in the groove is equal to or less than a depth of the groove.

3. The method according to claim 2, wherein forming, in the grooves, the piezoelectric layers comprises:
    forming piezoelectric material layers on the bottom electrode layers using the mask pattern layer as a mask, wherein each piezoelectric material layer protrudes from the surface of the substrate in which the grooves are disposed after the forming of the piezoelectric material layers;
    removing the mask pattern layer; and
    polishing the piezoelectric material layer until a surface of the piezoelectric material layer is flush with the surface of the substrate, to form the piezoelectric layers.

4. The method according to claim 3, wherein forming, in the grooves, the top electrode layers comprises:
    depositing, on the surface of the substrate, a top electrode material layer that covers the piezoelectric layers; and
    patterning the top electrode material layer, to form a top electrode layer on each piezoelectric layer, wherein thicknesses of the top layer electrode layers are the same.

5. The method according to claim 2, wherein forming, in the grooves, the piezoelectric layers comprises:
    forming the piezoelectric layers on the bottom electrode layers in the grooves by using the mask pattern layer as a mask, wherein after the piezoelectric layers are formed, in each groove of the grooves, a sum of a thickness of the bottom electrode layer and a thickness of the piezoelectric layer is less than a depth of the groove, and wherein thicknesses of the piezoelectric layers in the grooves are the same.

6. The method according to claim 5, wherein after forming the piezoelectric layers on the bottom electrode layers in the grooves using the mask pattern layer as a mask, the method further comprises:
    depositing, using the mask pattern layer as a mask, a top electrode material layer that covers the piezoelectric layers in the grooves;
    removing the mask pattern layer after patterning the top electrode material layer, to form, in each groove of the grooves, a top electrode material layer that protrudes from the surface of the substrate out of the groove; and
    polishing a protruding part of the top electrode material layers until surfaces of the top electrode material layers are flush with the surface of the substrate, to form the top electrode layers.

7. The method according to claim 1, wherein when the plasma etching is performed on the substrate using the mask pattern layer as a mask, etching is performed by using an Ar+ ion or a He+ ion.

8. The method according to claim 1, wherein the mask material layer comprises a high-molecular polymer material, and the substrate comprises an insulating material.

9. The method according to claim 1, wherein the imprint template comprises a quartz material and is formed using an ion grinding milling process.

10. The method according to claim 1, wherein pressing the mask material layer in the thickness direction of the substrate using the imprint template, to form, on the mask material layer through imprinting, the mask pattern layer comprises:
    applying specific external force to the imprint template, to press the mask material layer in the thickness direction of the substrate; and
    after the substrate on which the imprint template is pressed is heated, removing the imprint template to form the mask pattern layer comprising the plurality of mask grooves.

11. A method, comprising:
    forming an imprint template, wherein the imprint template comprises an imprint plate and a plurality of imprint dies protruding from a surface of the imprint plate, and at least two imprint dies of the plurality of imprint dies have different heights relative to the surface of the imprint plate;
    forming a mask material layer on a substrate;
    applying the imprint template to the mask material layer, to form, on the mask material layer, a mask pattern layer, wherein the mask pattern layer comprises a plurality of mask grooves having different depths;
    etching the substrate using the mask material layer as a mask, to form, on a surface of the substrate, grooves that correspond to positions of the plurality of mask grooves, wherein depths of at least two grooves in the grooves are different, the depths of the at least two grooves being different corresponds to the mask grooves having depths corresponding to the different heights of the imprint dies, and the grooves in the substrate are formed in a single etching process using only the mask material layer as a mask; and
    forming, in the grooves, bottom electrode layers, piezoelectric layers, and top electrode layers that are stacked in a direction that is perpendicular to a major surface of the substrate, wherein in the direction that is perpendicular to the major surface of the substrate, thicknesses of the bottom electrode layers are the same and are all less than depths of the grooves, and piezoelectric layer thicknesses of at least two piezoelectric layers are different, or top electrode layer thicknesses of at least two top electrode layers are different, and wherein each bottom electrode layer is formed using a single photolithography process that uses the mask pattern layer as a mask, and each piezoelectric layer is formed using another single photolithography process that uses the mask pattern layer as a mask.

12. The method according to claim 11, wherein piezoelectric layer thicknesses of the at least two piezoelectric layers are different.

13. The method according to claim 11, wherein top electrode layer thicknesses of the at least two top electrode layers are different.

14. The method according to claim 11, wherein etching the substrate using the mask material layer as a mask comprises plasma etching the substrate using the mask material layer as a mask.

15. The method according to claim 14, wherein the plasma etching is performed by using an Ar+ ion.

16. The method according to claim 14, wherein the plasma etching is performed by using a He+ ion.

17. The method according to claim 11, wherein forming, in the grooves, the top electrode layers comprises:
   depositing a top electrode material layer that covers the piezoelectric layers; and
   patterning the top electrode material layer, to form a top electrode layer on each piezoelectric layer, wherein thicknesses of the top layer electrode layers are the same.

18. The method according to claim 1, wherein the heights of the plurality of imprint dies on the imprint template are adjustable.

19. The method according to claim 13, wherein the at least two top electrode layers are formed at the same time in using a same formation process.

* * * * *